United States Patent
Kitajima et al.

(10) Patent No.: US 8,404,547 B2
(45) Date of Patent: Mar. 26, 2013

(54) SEMICONDUCTOR DEVICE AND MANUFACTURING METHOD THEREOF

(75) Inventors: Yuichiro Kitajima, Chiba (JP); Hideo Yoshino, Chiba (JP)

(73) Assignee: Seiko Instruments Inc. (JP)

( * ) Notice: Subject to any disclaimer, the term of this patent is extended or adjusted under 35 U.S.C. 154(b) by 711 days.

(21) Appl. No.: 12/510,858

(22) Filed: Jul. 28, 2009

(65) Prior Publication Data

US 2010/0025764 A1 Feb. 4, 2010

(30) Foreign Application Priority Data

Jul. 29, 2008 (JP) ................................. 2008-195014

(51) Int. Cl.
*H01L 21/336* (2006.01)
(52) U.S. Cl. ................. 438/286; 257/336; 257/E29.279
(58) Field of Classification Search .................. 438/286, 438/298; 257/E29.279, 336, 343
See application file for complete search history.

(56) References Cited

U.S. PATENT DOCUMENTS

| | | | | |
|---|---|---|---|---|
| 5,898,201 | A | * | 4/1999 | Hsu et al. ........................ 257/343 |
| 6,737,707 | B2 | * | 5/2004 | Kikuchi et al. ................. 257/347 |
| 7,196,393 | B2 | * | 3/2007 | Suzuki et al. .................. 257/502 |
| 7,575,967 | B2 | * | 8/2009 | Saitoh et al. ................... 438/197 |
| 2007/0215949 | A1 | * | 9/2007 | Kijima ............................ 257/355 |
| 2009/0212361 | A1 | * | 8/2009 | Kitajima ......................... 257/343 |
| 2010/0102386 | A1 | * | 4/2010 | You ................................. 257/336 |

FOREIGN PATENT DOCUMENTS

JP 06-029313 2/1994

* cited by examiner

*Primary Examiner* — Matthew Landau
*Assistant Examiner* — Sun M Kim
(74) *Attorney, Agent, or Firm* — Brinks Hofer Gilson & Lione

(57) ABSTRACT

Provided is a manufacturing method for an offset MOS transistor capable of operating safely even under a voltage of 50 V or higher. In the offset MOS transistor which includes a LOCOS oxide film, the LOCOS oxide film formed in a periphery of a drain diffusion layer, in which a high withstanding voltage is required, is etched, and the drain diffusion layer is formed so as to spread into a surface region of a semiconductor substrate located below a region in which the LOCOS oxide film is thinned. As a result, end portions of the drain diffusion layer are covered by an offset diffusion layer, whereby electric field concentration occurring in a region of a lower portion of the drain diffusion layer can be relaxed.

3 Claims, 3 Drawing Sheets

SEMICONDUCTOR DEVICE AND MANUFACTURING METHOD THEREOF

RELATED APPLICATIONS

This application claims priority under 35 U.S.C. §119 to Japanese Patent Application No. JP2008-195014 filed on Jul. 29, 2008, the entire content of which is hereby incorporated by reference.

BACKGROUND

1. Field of the Invention

The present invention relates to a semiconductor device which includes a field effect transistor having a LOCOS (local oxidation-of-silicon) offset for high voltage operation, and to a manufacturing method for the semiconductor device.

2. Description of the Related Art

Recent requirements from the market for integrated circuits (ICs), such as voltage regulators and switching regulators, which control a power supply voltage to obtain a constant voltage, have become diversified, seeking for, for example, an IC capable of ensuring safety operation even under a voltage range of 50 V or higher. As a field effect transistor (hereinafter referred to as a MOS (metal-oxide semiconductor) transistor) to be used in ICs for high voltage operation, there is known a MOS transistor with a LOCOS offset drain structure as an example of a conventional planar MOS transistor for high voltage operation.

FIGS. 3A to 3C illustrate a manufacturing method for a LOCOS offset MOS transistor. As illustrated in FIG. 3A, a sacrificial oxide film 22 and a nitride film 21 are deposited on a P-type silicon substrate, the nitride film 21 is selectively removed using photoresist as a mask, which is patterned to have an openings for a target region thereof, and an N-type offset diffusion layer 31 is formed through ion implantation. Next, as illustrated in FIG. 3B, using the nitride film 21 as a pattern, a LOCOS oxide film 23 is selectively formed through, for example, wet oxidation. Then, the nitride film 21 and the sacrificial oxide film 22 are removed to form a gate oxide film 24, and, for example, a polycrystalline silicon film is deposited on the gate oxide film 24. The polycrystalline silicon film is removed using photoresist as a mask, which is patterned to have an opening for a target region thereof, thereby forming a gate electrode 25. An N-type drain diffusion layer 34 and an N-type source diffusion layer 35 are formed through ion implantation using photoresist as a mask, which is patterned to have an opening for a target region thereof, thereby obtaining the structure of FIG. 3C.

According to the conventional structure illustrated in FIG. 3C, electric field relaxation between the gate electrode and the drain diffusion layer can be enhanced to achieve high voltage operation by appropriately setting a thickness of the LOCOS oxide film 23 and a concentration of the offset diffusion layer 31. However, in a junction portion between the offset diffusion layer 31 and the drain diffusion layer 34, the offset diffusion layer 31 cannot sufficiently cover a lower edge 34a of the drain diffusion layer 34 due to fluctuations in thickness of the LOCOS oxide film 23 and the nitride film 21 caused during the manufacturing process, resulting in a structure insufficient to relax electric field concentration on the lower edge 34a of the drain diffusion layer 34. For example, when the concentration of the offset diffusion layer 31 is set sufficiently high and the offset diffusion layer 31 is diffused up to the lower edge 34a of the drain diffusion layer 34, a depletion layer cannot extend from the offset diffusion layer 31, with the result that the electric field between the gate electrode and the drain diffusion layer enhances, becoming a factor for causing avalanche breakdown at a relatively low voltage. In the device design of such a high voltage operation element operative at 50 V, it becomes difficult to adopt the above-mentioned structure.

A countermeasure against the problem described above is disclosed in JP 06-29313 A, proposing a method in which a trench is formed in an offset portion of a LOCOS offset MOS transistor, an offset diffusion layer is formed therein, and a LOCOS oxide film fills the trench, whereby an electric field concentration region of a heavily-doped drain layer is covered with an aid of the offset diffusion.

According to the structure of the MOS transistor disclosed in JP 06-29313 A, an effective width of the offset diffusion layer increases, whereby a resistance component increases to lower the drivability of the MOS transistor. Further, the recess portion into which the LOCOS oxide film is embedded has a shape that flares toward the bottom. Accordingly, the offset diffusion layer also has a structure that flares toward the bottom, and the diffusion layer is structured to extend also in a channel direction of the MOS transistor. Accordingly, in order to prevent a leakage current flow due to the punch through phenomenon that occurs when a high voltage is applied to the drain electrode so that a depletion layer generated between the drain offset diffusion layer and a substrate makes a contact with a depletion layer of a source diffusion layer side, it is necessary to set a gate length of the MOS transistor larger. This condition is significant particularly in a case where both of the drain electrode and a source electrode are required to have a high withstanding voltage, which significantly affects its manufacturing cost due to increase in size.

Above all, according to the conventional structure, the withstanding voltage between the gate electrode and the drain electrode varies due to manufacturing fluctuation during the formation of the recess portion for the offset region and during the formation of the LOCOS oxide film filling the recess portion. For example, if the recess portion is formed deeper due to the manufacturing fluctuation and the LOCOS oxide film grows thinner, a channel end portion of the offset diffusion layer has a shape with sharp corners, with the result that the withstanding voltage is extremely deteriorated because the electric field concentration occurs. Accordingly, taking the manufacturing fluctuation into account, it is extremely difficult to ensure high voltage operation with the above-mentioned structure.

SUMMARY OF THE INVENTION

In order to solve the above-mentioned problems, the present invention employs the following means.

(1) A manufacturing method for a semiconductor device including a LOCOS offset field effect transistor, which includes:

forming a sacrificial oxide film on a first-conductivity-type semiconductor substrate;

forming a nitride film on the sacrificial oxide film, and etching only a target region of the nitride film with a pattern using photoresist;

forming a second-conductivity-type offset diffusion layer only in a region which is to become a first offset diffusion layer through ion implantation;

forming a LOCOS oxide film in the region in which the nitride film is etched;

removing the nitride film and the sacrificial oxide film;

forming a gate oxide film on a surface of the first-conductivity-type semiconductor substrate, forming a polycrystalline silicon film on the gate oxide film, and etching only a target region of the polycrystalline silicon film with a pattern using photoresist;

etching, with a pattern using photoresist, a region of the gate oxide film and the LOCOS oxide film, below which a heavily-doped diffusion layer serving as a drain diffusion layer is formed, so as to reduce a film thickness of the LOCOS oxide film toward the drain diffusion layer, the region corresponding to a formation portion of the LOCOS oxide film; and forming a second-conductivity-type heavily-doped diffusion layer through ion implantation.

(2) The manufacturing method for a semiconductor device, in which the etching the gate oxide film and the LOCOS oxide film includes performing isotropic etching.

(3) A semiconductor device which includes:

a first-conductivity-type semiconductor substrate;

a gate oxide film which is formed on a part of a surface of the first-conductivity-type semiconductor substrate, and includes one end and another end;

a second-conductivity-type source diffusion layer formed in a vicinity of a first surface of the first-conductivity-type semiconductor substrate on a side of the one end of the gate oxide film;

a LOCOS oxide film including one end and another end, the one end being brought into contact with the gate oxide film at the another end of the gate oxide film;

a gate electrode formed on the gate oxide film so as to stretch from an end portion of the second-conductivity-type source diffusion layer to the LOCOS oxide film;

a second-conductivity-type offset diffusion layer formed in a vicinity of a second surface of the first-conductivity-type semiconductor substrate located below the LOCOS oxide film; and a second-conductivity-type drain diffusion layer formed in a vicinity of a third surface of the first-conductivity-type semiconductor substrate so as to be adjacent to the another end of the LOCOS oxide film, which is located on a side opposite to the gate oxide film, in which:

the LOCOS oxide film has a thickness which is continuously reduced from a position apart from the gate electrode to the another end of the LOCOS oxide film to be thinner than an initial thickness of the LOCOS oxide film;

the LOCOS oxide film includes a surface of the another end of the LOCOS oxide film which is located lower than the third surface of the first-conductivity-type semiconductor substrate corresponding to a surface of the second-conductivity-type drain diffusion layer; and the second-conductivity-type drain diffusion layer includes end portions which respectively spread to a vicinity of a fourth surface of the first-conductivity-type semiconductor substrate located below a region in which the thickness of the LOCOS oxide film is reduced, and overlap with the second-conductivity-type offset diffusion layer.

In the LOCOS offset MOS transistor, the LOCOS oxide film formed in a periphery of the drain diffusion layer and/or the source diffusion layer, in which high voltage operation is required, is etched to form the drain diffusion layer or the source diffusion layer so as to cover a region in which the LOCOS oxide film is removed. As a result, the lower portion of the drain diffusion layer or the source diffusion layer is covered by the offset diffusion layer, whereby the electric field concentration occurring in the region of the lower portion of the drain diffusion layer can be relaxed, permitting supply of a semiconductor device which includes a MOS transistor capable of ensuring safety operation even at a voltage of 50 V or higher.

DETAILED DESCRIPTION OF THE PREFERRED EMBODIMENTS

Referring to the attached drawings, a preferred mode of the present invention is described in detail below.

FIGS. 1A to 1D illustrate a semiconductor device and a manufacturing method thereof according to an embodiment of the present invention. In the following description, a case of an N-channel MOS transistor is given for an example.

Figure 1A:
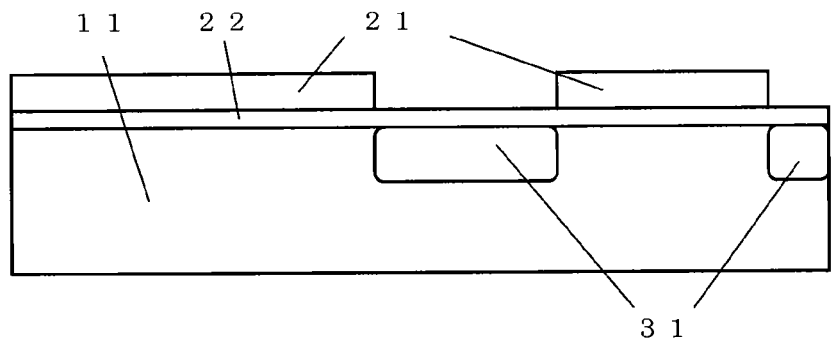
FIGS. 1A to 1D are schematic sectional views illustrating a process flow of a manufacturing method for a semiconductor device according to an embodiment of the present invention.

FIG. 1A illustrates a state in which: a sacrificial oxide film 22 is formed on a P-type semiconductor substrate 11; a nitride film 21 is formed on the sacrificial oxide film 22; the nitride film 21 is patterned so as to have openings for target regions; and then offset diffusion layers 31 are formed in each surface region of the P-type semiconductor substrate 11 of the openings through ion implantation. In the patterning of the nitride film 21, photoresist is uniformly applied on the nitride film 21, and openings for target regions are made in the photoresist using photolithography. Then, using the patterned photoresist as a mask, dry etching is performed using a fluorine gas or the like. The same mask that was used during the etching of the nitride film 21 is used as a mask for forming the offset diffusion layer 31 through ion implantation. A final impurity concentration of the offset diffusion layer 31 is set to fall within a range of from approximately $1 \times 10^{16}$ atom/cm$^3$ to $1 \times 10^{18}$ atom/cm$^3$. Phosphorus is used as an impurity to be introduced. An implantation energy depends on an amount of the impurity to be introduced, but is set so that a final diffusion length in the depth direction of the offset diffusion layer 31 from a surface of the semiconductor substrate becomes 0.3 μm or larger.

Figure 1B:
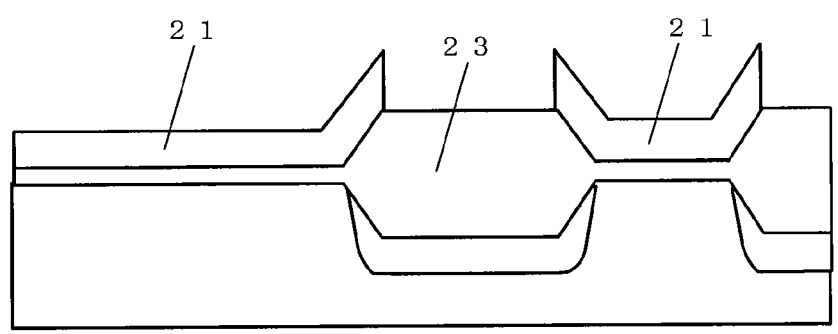
Figure 1C:
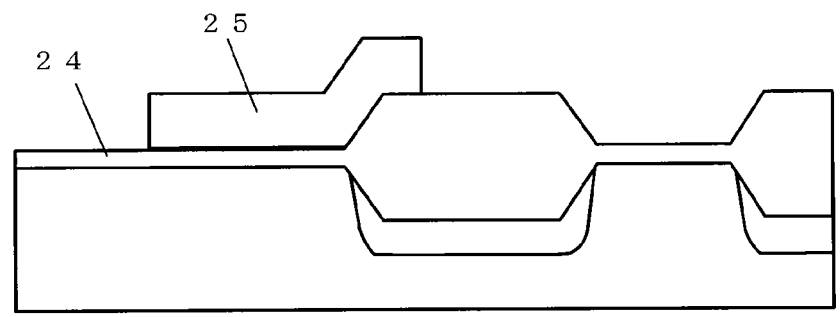

Next, thermal oxidation is performed using the nitride film 21 as a mask, to thereby form a LOCOS oxide film 23 having a thickness of approximately 600 nm to 800 nm as illustrated in FIG. 1B. Then, the nitride film 21 and the sacrificial oxide film 22 are removed, and gate oxide films 24 are formed through thermal oxidation. A polycrystalline silicon film having a film thickness of 200 nm to 400 nm is formed on an entire surface of the gate oxide film 24 through, for example, chemical vapor deposition. Then, phosphorus or the like is diffused into the polycrystalline silicon through solid phase diffusion so that an impurity concentration thereof becomes approximately $1 \times 10^{20}$ atom/cm$^3$, thereby imparting conductivity to the polycrystalline silicon film. In this case, as an alternative to the solid phase diffusion, ion implantation may be used to implant impurities into the polycrystalline silicon. Thereafter, the polycrystalline silicon film having conductivity is patterned to form a gate electrode 25 extending from a part of the LOCOS oxide film 23 onto the gate oxide film 24 of a source region side, thereby obtaining the structure illustrated in FIG. 1C.

Next, photoresist is formed to have an opening for a periphery of a region which subsequently becomes a drain diffusion layer. Then, a part of the LOCOS oxide films 23 located on both sides of the region and the gate oxide film 24 sandwiched between the LOCOS oxide films 23 are isotropically etched through wet etching. In this case, the gate oxide film 24 formed on a region which subsequently becomes a source diffusion layer may be etched simultaneously.

Figure 1D:
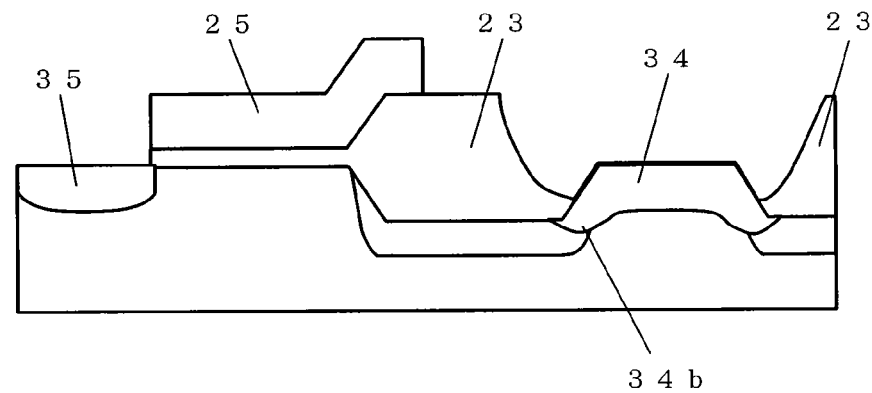

Thereafter, using a patterned photoresist having openings for target regions such as a region which subsequently becomes the drain diffusion layer and a region for a source diffusion layer, from which the LOCOS oxide films 23 are removed, as a mask, the impurities are implanted into opening portions through ion implantation. Thermal treatment is performed to form the drain diffusion layer 34 and the source diffusion layer 35, thereby obtaining the structure illustrated in FIG. 1D. In this case, when the ion implantation is performed to form the drain diffusion layer 34 and the source diffusion layer 35, phosphorus or arsenic is used as an impurity to be introduced, and each final surface impurity concentration of the drain diffusion layer 34 and the source diffusion layer 35 is set to $1 \times 10^{19}$ atom/cm$^3$ or higher. The ion implantation energy is set so that each diffusion length in the depth direction of the drain diffusion layer 34 and the source diffusion layer 35 from the surface of the semiconductor substrate is approximately 0.2 μm. As described above, the LOCOS oxide film 23 is isotropically etched in the etching of the LOCOS oxide film 23, and accordingly an end of the LOCOS oxide film 23 on the drain diffusion layer 34 side is formed in a round shape as illustrated in FIG. 1D. As a result, the LOCOS oxide film 23 formed on the offset diffusion layer 31 has a shape in which a thickness thereof is reduced toward the end of the drain diffusion layer 34. Since the drain diffusion layer 34 is formed through ion implantation so as to cover the region in which the LOCOS oxide film 23 is etched, each of the ends of the drain diffusion layer 34 is formed to extend into the offset diffusion layer 31. Further, the drain diffusion layer 34 has a concentration distribution corresponding to the thickness of the LOCOS oxide film 23 after etching. In other words, an impurity concentration of the end portion of the drain diffusion layer 34 is lower than an impurity concentration of a center portion of the drain diffusion layer 34. A diffusion layer region for electric field relaxation is thus formed in the drain end portion. Besides, a depth of the drain diffusion layer 34 changes according to the impurity concentration distribution of the drain diffusion layer 34. Accordingly, a lower edge 34b of the drain diffusion layer 34 has a smooth shape, whereby electric field concentration is less likely to occur. As a result, it becomes possible to ensure high voltage operation.

Figure 2:
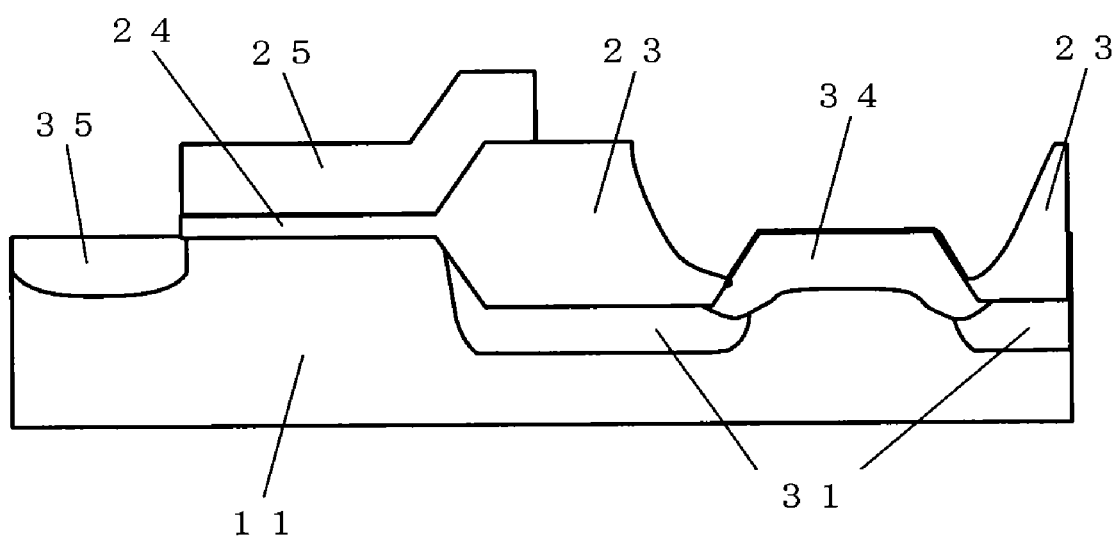
FIG. 2 illustrates a schematic sectional view of the semiconductor device according to the embodiment of the present invention.
Figure 3A:
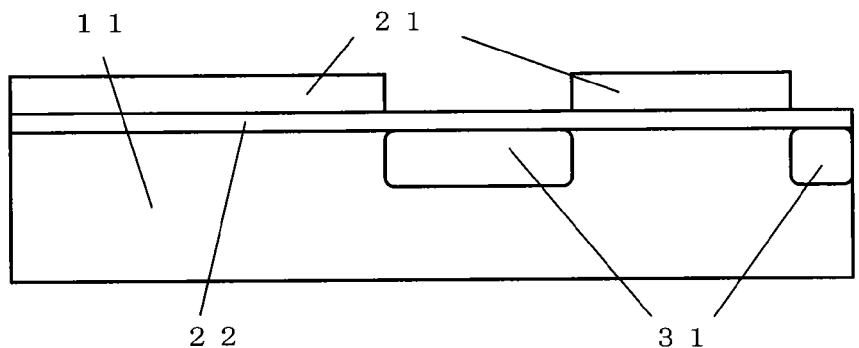
FIGS. 3A to 3C are schematic sectional views illustrating a process flow of a manufacturing method for a semiconductor device according to a conventional embodiment.
Figure 3B:
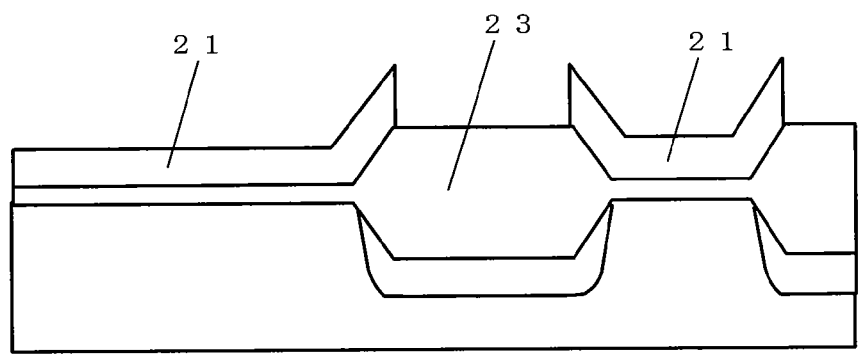
Figure 3C:
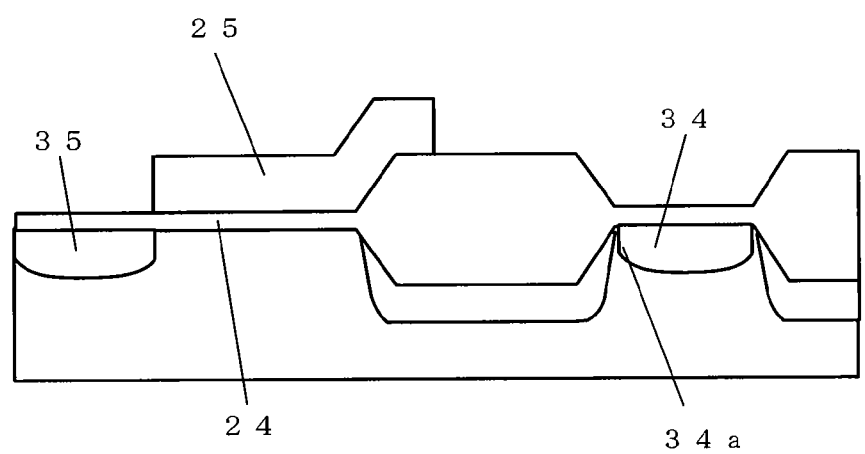

FIG. 2 illustrates a schematic sectional view of the semiconductor device according to the present invention manufactured by the above-mentioned manufacturing method. The semiconductor device includes an offset drain MOS transistor formed on the P-type semiconductor substrate 11, in which the LOCOS oxide film 23 is formed on the surface of the substrate, and the gate oxide film 24 is formed above an active region between the LOCOS oxide films 23. The source diffusion layer 35 formed of the heavily-doped N-type impurities is formed at a position apart from the LOCOS oxide film 23, and the gate electrode 25 is formed on the gate oxide film 24. The gate electrode 25 is formed so as to stretch from an end portion of the source diffusion layer 35 to a part of the LOCOS oxide film 23. The N-type offset diffusion layer 31 is formed below the LOCOS oxide film 23. The impurity concentration of the offset diffusion layer 31 is lower than the impurity concentrations of the source diffusion layer 35 and the drain diffusion layer 34. The drain diffusion layer 34 is formed between the offset diffusion layers 31. A part of the LOCOS oxide film 23 adjacent to the drain diffusion layer 34 is contoured into the round shape which is a peculiar shape as a result of the wet etching. An upper portion of the drain diffusion layer 34 formed of the heavily-doped N-type impurities is larger in height than an end portion of the LOCOS oxide film 23. Each of the end portions of the drain diffusion layer 34 is brought into contact with the end portion of the contoured LOCOS oxide film 23 and an end portion of the offset diffusion layer 31. The impurity concentration of the end portion of the drain diffusion layer 34 is lower than the impurity concentration of the center portion of the drain diffusion layer 34. With the above-mentioned structure, the electric field concentration occurring in a region of the lower portion of the drain diffusion layer 34 can be relaxed, whereby it becomes possible to provide a semiconductor device which includes a MOS transistor capable of ensuring safety operation even under a voltage of 50 V or higher.

In the above-mentioned description, the present invention has been described in detail for the case of the N-channel MOS transistor. However, it is needless to say that the present invention is also applicable to a case of a P-channel MOS transistor. As an operating method of the MOS transistor, when the MOS transistor is used under such condition that the source electrode and the drain electrode are switched therebetween, it is necessary to ensure a high withstanding voltage in both of the source electrode and the drain electrode. However, even in such a case as described above, a high withstanding voltage can be ensured with the structure according to the present invention. Further, in the above-mentioned description, the case where the MOS transistor is formed on the semiconductor substrate is described by way of example. However, the present invention is also applicable to a case where a MOS transistor formed on a P-type deep diffusion layer, that is, a so-called well diffusion layer. In addition, the characteristics of the MOS transistor are not deteriorated compared with the case of the conventional structure since the MOS transistor according to the present invention does not differ from the conventional LOCOS offset MOS transistor in drain structure at the end of the channel.

What is claimed is:

1. A manufacturing method for a semiconductor device including a field effect transistor having a LOCOS offset, the manufacturing method comprising:
    forming a sacrificial oxide film on a semiconductor substrate having a first conductivity type;
    forming a nitride film on the sacrificial oxide film,
    etching only a target region of the nitride film;
    forming an offset diffusion layer having a second conductivity type through ion implantation;
    forming a LOCOS oxide film on the region in which the nitride film is etched;
    removing the nitride film and the sacrificial oxide film;
    forming a gate oxide film on a surface of the semiconductor substrate, forming a polycrystalline silicon film on the gate oxide film, and etching only a target region of the polycrystalline silicon film;
    forming a heavily-doped diffusion layer having a second conductivity type through ion implantation, the heavily-doped diffusion layer serving as a drain diffusion layer;
    etching a part of the LOCOS oxide film adjacent to the drain diffusion layer so as to reduce a film thickness of the LOCOS oxide film toward the drain diffusion layer, wherein an end of the LOCOS oxide film on a drain diffusion layer side is formed in a round shape; and wherein an end of the drain diffusion layer adjacent to the LOCOS oxide film is formed to extend into the offset diffusion layer to cover a region where the part of the LOCOS oxide film is etched, and an impurity concentration of the end of the drain diffusion layer adjacent to the LOCOS oxide film is lower than an impurity concentration of a center portion of the drain diffusion layer.

2. A manufacturing method for a semiconductor device according to claim 1, wherein the etching the gate oxide film and the LOCOS oxide film includes performing isotropic etching.

3. A semiconductor device, comprising:
a semiconductor substrate having a first conductivity type;
a gate oxide film disposed on a part of a surface of the semiconductor substrate;
a source diffusion layer having a second conductivity type disposed in a vicinity of the surface of the semiconductor substrate adjacent to the gate oxide film;
a LOCOS oxide film positioned apart from the source diffusion layer, wherein the gate oxide film is arranged between the source diffusion layer and the LOCOS oxide film;
a gate electrode disposed on the gate oxide film extending from an end portion of the source diffusion layer to the LOCOS oxide film;
a offset diffusion layer having a second conductivity type disposed in a vicinity of the surface of the semiconductor substrate and located underneath the LOCOS oxide film; and
a drain diffusion layer having a second conductivity type disposed in a vicinity of the surface of the semiconductor substrate and arranged adjacent to the LOCOS oxide film on a side opposite to the gate oxide film, the drain diffusion layer positioned between the offset diffusion layer and another offset diffusion layer arranged underneath a neighboring LOCOS oxide film;
wherein:
the LOCOS oxide film has a thickness which is continuously reduced toward the drain diffusion layer;
wherein an end of the LOCOS oxide film on a drain diffusion layer side is contoured into a round shape; and
wherein an end of the drain diffusion layer adjacent to the LOCOS oxide film is formed to extend into the offset diffusion layer to cover a region having an etched part of the LOCOS oxide film, and an impurity concentration of the end of the drain diffusion layer adjacent to the LOCOS oxide film is lower than an impurity concentration of a center portion of the drain diffusion layer.

* * * * *